United States Patent
Tsukigata et al.

(10) Patent No.: US 8,405,176 B2
(45) Date of Patent: Mar. 26, 2013

(54) PHOSPHORUS PASTE FOR DIFFUSION AND PROCESS FOR PRODUCING SOLAR BATTERY UTILIZING THE PHOSPHORUS PASTE

(75) Inventors: Shintarou Tsukigata, Annaka (JP); Toshifumi Matsuoka, Tokyo (JP); Kenji Yamamoto, Annaka (JP); Toyohiro Ueguri, Annaka (JP); Naoki Ishikawa, Annaka (JP); Hiroyuki Otsuka, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 34 days.

(21) Appl. No.: 12/933,738
(22) PCT Filed: Mar. 18, 2009
(86) PCT No.: PCT/JP2009/055278
§ 371 (c)(1),
(2), (4) Date: Nov. 12, 2010
(87) PCT Pub. No.: WO2009/116569
PCT Pub. Date: Sep. 24, 2009

(65) Prior Publication Data
US 2011/0045624 A1 Feb. 24, 2011

(30) Foreign Application Priority Data
Mar. 21, 2008 (JP) ................. 2008-074672

(51) Int. Cl.
*H01L 27/14* (2006.01)
*H01L 21/02* (2006.01)
*H01L 31/00* (2006.01)
*C08K 5/49* (2006.01)

(52) U.S. Cl. ............... 257/431; 257/607; 257/E21.135; 136/261; 524/115

(58) Field of Classification Search .............. 257/431, 257/607, E21.135; 136/261; 524/115
See application file for complete search history.

(56) References Cited

U.S. PATENT DOCUMENTS
4,104,091 A * 8/1978 Evans et al. .................. 438/57
(Continued)

FOREIGN PATENT DOCUMENTS
EP 2043136 A1 4/2009
JP 56-018416 A 2/1981
(Continued)

OTHER PUBLICATIONS
International Search Report of PCT/JP2009/055278, mailing date Jun. 16, 2009.

*Primary Examiner* — Charles Garber
*Assistant Examiner* — Ron Pompey
(74) *Attorney, Agent, or Firm* — Westerman, Hattori, Daniels & Adrian, LLP

(57) ABSTRACT

Disclosed is a phosphorus paste for diffusion that is used in continuous printing of a phosphorus paste for diffusion on a substrate by screen printing. The phosphorus paste for diffusion does not undergo a significant influence of ambient humidity on viscosity and has no possibility of thickening even after a large number of times of continuous printing. The phosphorus paste for diffusion is coated on a substrate by screen printing for diffusion layer formation on the substrate. The phosphorus paste for diffusion includes a doping agent containing phosphorus as a dopant for the diffusion layer, a thixotropic agent containing an organic binder and a solid matter, and an organic solvent. The doping agent is an organic phosphorus compound.

9 Claims, 2 Drawing Sheets

U.S. PATENT DOCUMENTS

| | | | |
|---|---|---|---|
| 4,152,286 A * | 5/1979 | Crosson et al. | 106/287.16 |
| 4,626,613 A | 12/1986 | Wenham et al. | |
| 4,726,850 A | 2/1988 | Wenham et al. | |
| 4,748,130 A | 5/1988 | Wenham et al. | |
| 5,726,065 A * | 3/1998 | Szlufcik et al. | 438/57 |
| 6,180,869 B1 | 1/2001 | Meier et al. | |
| 2009/0020158 A1 | 1/2009 | Ohtsuka et al. | |

FOREIGN PATENT DOCUMENTS

| | | | |
|---|---|---|---|
| JP | 8-037318 A | | 2/1996 |
| JP | 8-191152 A | | 7/1996 |
| JP | 2001-38386 | * | 5/2000 |
| JP | 2002-075892 | * | 3/2002 |
| JP | 2002-075892 A | | 3/2002 |
| JP | 2004-221149 A | | 8/2004 |
| JP | 2004-273826 A | | 9/2004 |
| JP | 2004-281569 A | | 10/2004 |
| JP | 2006-310373 A | | 11/2006 |
| JP | 2007-035719 A | | 2/2007 |
| JP | 2007-053353 A | | 3/2007 |
| JP | 2008-021951 A | | 1/2008 |
| WO | 2006/117980 A1 | | 11/2006 |

* cited by examiner

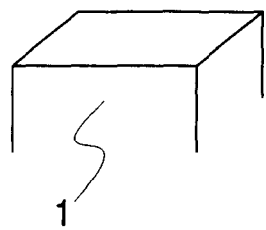
FIG.3A
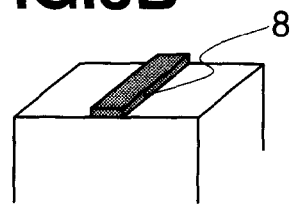
FIG.3B
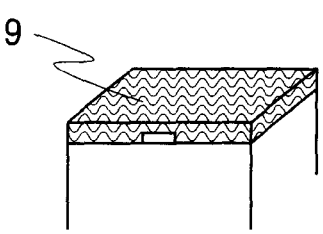
FIG.3C
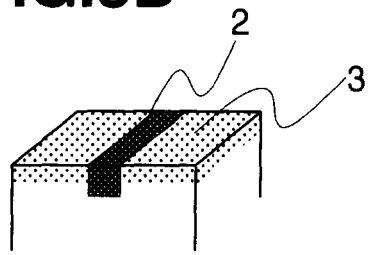
FIG.3D
PRINTING/BAKING
SPIN COATING
HEAT TREATMENT (DIFFUSION)
FIG.4
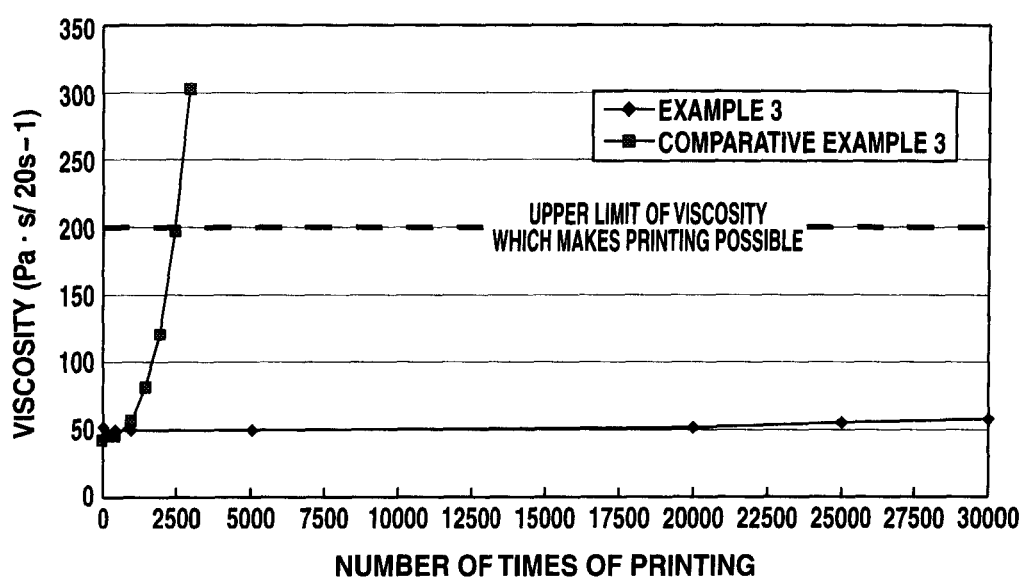

PHOSPHORUS PASTE FOR DIFFUSION AND PROCESS FOR PRODUCING SOLAR BATTERY UTILIZING THE PHOSPHORUS PASTE

TECHNICAL FIELD

The present invention relates to a phosphorus paste for diffusion that is applied to a semiconductor substrate by screen printing in forming a diffusion layer on the substrate, and, further, to a process for producing a solar cell in which a diffusion layer is formed on a substrate for a solar cell using the phosphorus paste for diffusion.

BACKGROUND ART

In manufacturing solar cells for civilian applications, at present, it is an important task to reduce the manufacturing cost and, in general, a method of producing a solar cell by the following steps is widely used. The details of the method are, for example, as follows.

First, there is prepared a p-type silicon substrate which is obtained by slicing, based on a multiwire method, a single-crystalline silicon ingot produced by a Czochralski (CZ) method or a polycrystalline silicon ingot produced by a casting method. Next, damages given to the substrate surface by the slicing are removed by an alkaline solution and, thereafter, a microscopic rugged pattern (texture) with a maximum height of about 10 μm is formed in both a light-receiving surface and a back surface. Subsequently, a dopant is thermally diffused into the substrate by one of various methods to form an n-type diffusion layer. Further, $TiO_2$ or SiN is deposited on the light-receiving surface in a thickness of, for example, about 70 nm to form an antireflective film. Next, a paste for a back-surface electrode that contains aluminum as a main ingredient is printed on the whole area of the back surface, followed by firing to form a back-surface electrode. On the other hand, a light-receiving surface electrode is formed by printing on the light-receiving surface a paste for a light-receiving surface electrode that contains silver as a main constituent in a comb pattern with a width of, for example, about 100 to 200 μm, followed by firing.

Such a technique is excellent in that various enhancing effects on solar cell characteristics such as energy conversion efficiency are attendantly realized, notwithstanding the technique involves a minimum number of steps necessary for fabricating the device. For instance, the thermal diffusion of the dopant in forming the diffusion layer in the substrate has a working effect of improving the diffusion length of small-number carriers in the bulk by a gettering action. In addition, the firing of aluminum printed on the back surface, during formation of the back-surface electrode, can simultaneously result in both formation of the electrode and formation of a $p^+$ high-concentration layer having a BSF (Back Surface Field) effect on the back surface. Furthermore, the antireflective film has both an optical effect (reduction in reflectance) and a function of reducing the recombination velocity of carriers generated near the silicon surface.

By the minimum required number of steps and some useful effects as above-mentioned, it is promised to manufacture civilian-use solar cells at lower costs than before.

Even with the above-mentioned excellent technique, however, the conversion efficiency of a solar cell utilizing a single-crystalline silicon substrate, for example, reaches an upper limit of about 16%, and a further considerable improvement in conversion efficiency cannot be expected. In fact, in order to sufficiently lower the contact resistance of a light-receiving surface electrode, the surface concentration of the dopant such as phosphorus in the diffusion layer should be about 2.0 to $3.0 \times 10^{20}$ $cm^{-2}$. When the substrate surface is made to contain the dopant in such a high concentration, the surface level becomes very high, so that carrier recombination near the light-receiving surface is accelerated. Therefore, short-circuit current and open-circuit voltage are restricted and, consequently, the conversion efficiency reaches an upper limit.

In view of this, there has been proposed a method for improving conversion efficiency by lowering the surface concentration in the diffusion layer formed at the light-receiving surface. For example, a proposal relating to this method has been known as disclosed in U.S. Pat. No. 6,180,869 (Patent Document 1). According to the document, low-ohmic contact can be formed even when the surface concentration in the diffusion layer is about $1.0 \times 10^{20}$ $cm^{-2}$ or below. This is realized by addition of a compound containing a dopant to the vicinity of a silver filler contained in the paste for electrode. As a result of this approach, a high-concentration layer of the dopant is formed beneath the electrode upon firing of the electrode.

However, by the method in which the dopant-containing compound is thus added near the silver filler contained in the paste for electrode, it is impossible to form a contact between the diffusion layer and the electrode in a stable manner. Therefore, there is a problem that the solar cell obtained is low in fill factor and in reliability.

Besides, as a method of enhancing conversion efficiency by forming a high-concentration diffusion layer (emitter layer) containing a dopant in a high concentration only beneath an electrode while lowering the surface concentration in the diffusion layer in other areas of a light-receiving surface, that is, by forming a two-stage (two-level) emitter, there has been known, for example, "Photo-electric conversion device and process for producing the same" as disclosed in JP-A 2004-273826 (Patent Document 2). This method is a modification, from electroplating method to screen printing method, of a process for forming an electrode in a solar cell with an embedded type electrode that has been known from JP-A 8-37318 (Patent Document 3) and JP-A 8-191152 (Patent Document 4). It is said to be possible by this method to facilitate production control and to lower the production cost.

However, in order to obtain the two-stage emitter in the process for producing a solar cell with an embedded type electrode as described in Patent Document 2, a heat treatment for forming an n-type diffusion layer is followed by a heat treatment for forming a high-concentration n-type diffusion layer. Therefore, it is necessary to carry out heat treatment at least twice, which leads to complicated working steps and an increase in production cost.

In addition, as another method for enhancing conversion efficiency by forming a two-stage emitter, there has been known, for example, "Process for producing a solar cell" as disclosed in JP-A 2004-221149 (Patent Document 5). It is proposed in this document that individual coatings with a plurality of coating agents by an ink jet system are carried out simultaneously so as to create regions different in dopant concentration and/or dopant species by a simple step.

When phosphoric acid or the like is used as a dopant in such an ink jet system, however, a countermeasure against corrosion is needed, which leads to a complicated system and intricate maintenance. In addition, even if the coating agents different in dopant concentration and/or dopant species are individually coated by ink jet, diffusion by one run of heat treatment results in that a desired concentration difference cannot be obtained due to auto-doping.

Furthermore, as a further method for enhancing conversion efficiency by forming a high-concentration diffusion layer only beneath an electrode and lowering the surface concentration in the diffusion layer in other areas of a light-receiving surface, there has been known, for example, "Process for producing a solar cell" as disclosed in JP-A 2004-281569 (Patent Document 6).

In the process according to Patent Document 6, however, it is necessary to conduct diffusion heat treatment twice for forming a low-concentration diffusion layer and a high-concentration diffusion layer, so that the process is not simple. If the heat treatment is conducted only once, taking this drawback into account, the dopant concentration becomes high also in other areas than the area beneath the electrode of the light-receiving surface due to auto-doping. Consequently, the cell obtained would not show a high conversion efficiency.

Taking the foregoing into consideration, JP-A 2006-310373 (Patent Document 9) proposes a process wherein a first coating agent containing phosphoric acid and a second coating agent containing diphosphorus pentoxide are simultaneously applied to a p-type substrate by screen printing, followed by thermal diffusion, so as to simultaneously form a high-concentration diffusion layer and a low-concentration diffusion layer.

This ensures that the formation of a two-stage emitter that has been intricate due to formation of a diffusion mask or the like is made to be very simple, resulting in a lowering in production cost. Besides, since a sufficient surface concentration is maintained in the high-concentration diffusion layer, a low-ohmic contact can be formed easily. Consequently, a high-performance solar cell can be produced while maintaining the production yield at a high level.

Thus, the merit of using the screen printing method in constructing the two-stage emitter resides in that an arbitrary pattern can be formed easily, that a diffusion agent with a high dopant concentration can be applied to a substrate surface in a uniform thickness by one time of printing, and that dopant diffusion can be efficiently performed by a high-concentration phosphorus glass layer in the subsequent heat treatment. Besides, another merit lies in that a high-concentration diffusion layer can be formed by the printing treatment and the heat treatment which are each completed in a short time.

The application of the paste for diffusion that is used for forming the diffusion layer may thus be conducted by a screen printing method as in Patent Document 9, and may also be conducted by a spin coating method. The spin coating method is preferable for forming a layer on a surface in a uniform thickness, but is very wasteful because much of the material is scattered at the time of spinning. Examples of the coating liquid for diffusion that is used in spin coating include a coating liquid for phosphorus diffusion described in JP-A 2007-53353 (Patent Document 7) and a coating liquid for boron diffusion described in JP-A 2007-35719 (Patent Document 8).

In contrast to such a spin coating method, the screen printing method ensures, as in Patent Document 9, that a large amount of a diffusion agent can be layered on a substrate surface through a speedy printing treatment, without wasting the material.

As described also in Patent Document 7, however, a coating agent for diffusion is generally composed of a water-soluble phosphorus paste containing a phosphorus compound, a water-soluble polymer compound, and water, and the viscosity of the water-soluble paste is susceptible to variations by ambient environments such as humidity. Moreover, upon continuous printing, even a water-soluble phosphorus paste conditioned in viscosity undergoes thickening due to dehumidification after a large number of times of printing, with the result of clogging of screen meshes. Thus, with a water-soluble phosphorus paste, it has been impossible to stably carry out continuous printing for a long time or a large number of times.

DISCLOSURE OF THE INVENTION

Problems to be Solved by the Invention

The present invention has been made in consideration of the above-mentioned problems. Accordingly, it is an object of the present invention to provide a phosphorus paste for diffusion that is used in continuous printing of a phosphorus paste for diffusion on a substrate by screen printing, that does not undergo a significant influence of ambient humidity on viscosity, and that has no possibility of thickening even after a repeated continuous printing. It is another object of the present invention to provide a process for producing a solar cell utilizing the phosphorus paste for diffusion.

Means for Solving the Problems

In order to attain the above object, according to the present invention, there is provided a phosphorus paste for diffusion that is applied to a substrate by screen printing for forming a diffusion layer on the substrate, the phosphorus paste for diffusion including at least: a doping agent containing phosphorus as a dopant for the diffusion layer, a thixotropic agent containing an organic binder and a solid matter, and an organic solvent, wherein the doping agent is an organic phosphorus compound (Claim 1).

Thus, the phosphorus paste for diffusion is an organic phosphorus paste for diffusion that includes a doping agent which is an organic phosphorus compound, a thixotropic agent containing an organic binder and a solid matter, and an organic solvent, whereby it is possible to obtain a phosphorus paste for diffusion that is free of influence of ambient humidity on viscosity. Therefore, even where a desired pattern of the diffusion layer is a thin-line pattern, meshes of a screen on a screen printing plate are insusceptible to clogging, since the paste is restrained from thickening due to a continuous printing. Accordingly, with the paste for diffusion used in continuous screen printing, the number of times the continuous printing on a substrate with a single screen printing plate can be greatly increased. In addition, since the screen meshes are insusceptible to clogging, the phosphorus paste for diffusion that is applied onto the substrate can be made to have few defects as compared with a desired diffusion layer pattern.

Besides, since the phosphorus paste for diffusion includes a thixotropic agent containing an organic binder and a solid matter, the thixotropic property can be easily controlled, and the phosphorus paste for diffusion with the thixotropic property thus controlled ensures that the paste upon printing shows restrained blurring from the desired pattern.

Particularly, with the organic binder contained in the phosphorus paste for diffusion, the paste can have a good property for passing through the mesh openings of the screen printing plate. Besides, with the solid matter contained in the phosphorus paste for diffusion, the reduction in film thickness through drying after printing of the paste and the shrinkage through baking can be easily controlled by regulating the content of the solid matter.

In this case, preferably, the organic phosphorus compound is a monomer having a phosphate group and/or a monomer derivative having a phosphate group (Claim 2).

Where the organic phosphorus compound as the doping agent is thus a monomer having a phosphate group and/or a monomer derivative having a phosphate group, phosphorus in the phosphate group serves as a dopant source for the diffusion layer to be formed. As the monomer having a phosphate group and/or the monomer derivative having a phosphate group, those which are commercially available can be used. Thus, easy availability of material is ensured.

In addition, the solid matter is preferably particulate silica (Claim 3), and the organic binder is preferably polyvinyl acetate (Claim 4).

Where the solid matter in the thixotropic agent is particulate silica and the organic binder is polyvinyl acetate as just-mentioned, the particulate silica is likely to restrain the reduction in film thickness through drying after printing of the paste and restrain the contraction through baking, whereas the polyvinyl acetate is likely to control the property of the paste for passing through the mesh openings.

Preferably, the organic solvent is a high-boiling solvent having a boiling point of not less than 100° C. (Claim 5).

Where a high-boiling solvent having a boiling point of not less than 100° C. is thus used as the organic solvent contained in the phosphorus paste for diffusion, the paste obtained does not show variations in composition due to volatilization of the solvent in normal printing environments and is capable of being printed stably.

The phosphorus paste for diffusion as above may further include a silicon alkoxide (Claim 6).

Where the phosphorus paste for diffusion thus includes a silicon alkoxide, the silicon alkoxide serves as a linker for linking between the organic phosphorus compound as the doping agent and the particulate silica as the solid matter, and is hence effective in accelerating the sintering of the phosphorus component with silica during a diffusion heat treatment. Accordingly, outward diffusion of phosphorus can further be prevented. In addition, the silicon alkoxide is preferable in view of low material cost and easy availability.

According to the present invention, there is also provided a process for producing a solar cell using the phosphorus paste for diffusion, the process including coating a substrate with the phosphorus paste for diffusion by screen printing, and subjecting the substrate to a heat treatment to form a diffusion layer (Claim 7).

Where a solar cell is thus produced using the above-mentioned phosphorus paste for diffusion, the solar cell with high quality can be produced in good yield and at a greatly reduced production cost, since the phosphorus paste for diffusion permits a considerable improvement of the number of times of continuous printing possible, as compared with that in the prior art. Besides, where the organic phosphorus paste for diffusion as above is used, it is possible, for example, to produce a high-concentration diffusion layer and a low-concentration diffusion layer by a single run of diffusion heat treatment, whereby an intricate procedure can be obviated and simple steps can be realized.

Effect of the Invention

With the phosphorus paste for diffusion according to the present invention, it is possible to realize a phosphorus paste for diffusion that does not undergo a significant influence of ambient humidity on viscosity and has no possibility of thickening even after a repeated continuous printing.

In addition, with a solar cell produced using the phosphorus paste for diffusion according to the present invention, it is possible to produce a high-quality solar cell through a simple procedure and in good yield. It is also possible to increase the number of times of using a printing plate for continuous printing can be used. Accordingly, the production cost of the solar cell can be largely reduced.

BRIEF DESCRIPTION OF DRAWINGS

FIG. 3 shows image illustrations of the flow shown in FIG. 2.

FIG. 4 is a diagram showing the relationship between the number of times of continuous printing and the viscosity of paste in Example 3 and Comparative Example 3.

BEST MODE FOR CARRYING OUT THE INVENTION

Figure 1:
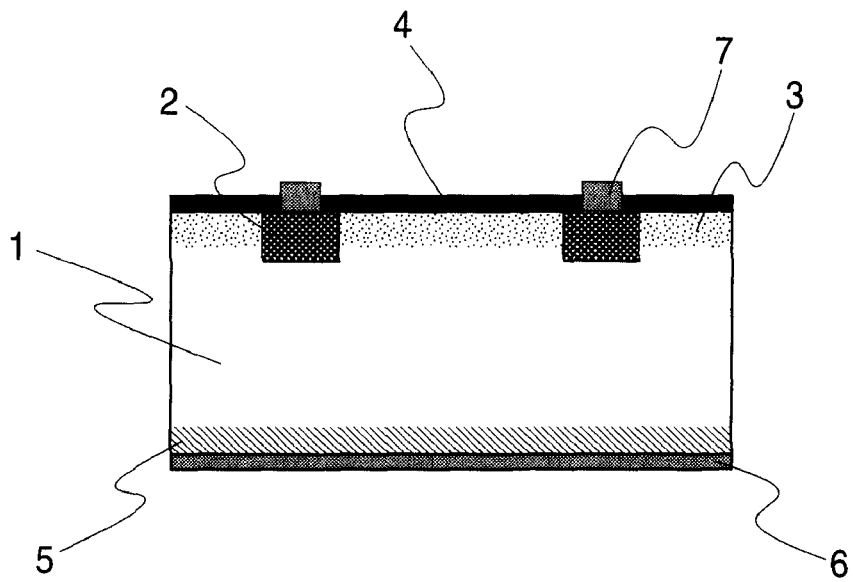
FIG. 1 is a schematic view of a solar cell to be produced.

As has been described above, a water-soluble phosphorus paste for diffusion for use in screen printing that has been conventionally used undergoes a significant influence of ambient environments such as humidity on viscosity and does not permit easy control of viscosity to a desired viscosity. Therefore, the paste is poor in stability of continuous printing, and the attendant non-uniformity of printing has hampered fabrication of precise semiconductor devices. In addition, the water-soluble phosphorus paste for diffusion according to the prior art has had the problem that, since water is contained therein, the paste undergoes thickening due to dehumidification as continuous printing is repeated, so that clogging of screen meshes occurs in early stage. Such clogging of meshes increases defects in the printed pattern and makes printing impossible. Therefore, it is necessary to frequently clean up the water-soluble phosphorus paste for diffusion that has clogged the meshes of the screen printing plate. For the clean-up, however, a cleaning liquid for dissociating the water-soluble phosphorus paste for diffusion that has solidified is used, producing a large amount of waste liquor, which increases the burden on environments and lowers the production yield.

In order to solve these problems, the present inventors made earnest researches. As a result of their studies, the inventors have found out a technique for largely improving the number of times of continuous printing can be performed with a single screen printing plate, in screen printing of a phosphorus paste for diffusion. Specifically, the inventors have found out that, by using an organic phosphorus compound as a doping agent to form an organic phosphorus paste for diffusion instead of using a conventional water-soluble phosphorus paste for diffusion that is susceptible to clogging of meshes due to thickening, it is possible to realize a novel phosphorus paste for diffusion that can be used for screen printing, that can be easily controlled to a desired viscosity without undergoing environmental influence of ambient humidity on viscosity, and that is excellent in stability of continuous printing. Based on the finding, the present invention has been completed.

Now, embodiments of the present invention will be specifically described below, but the invention is not limited to the embodiments.

First, an embodiment of an organic phosphorus paste for diffusion according to the present invention will be described.

A phosphorus paste for diffusion according to the invention is a phosphorus paste for diffusion that is used in applying a phosphorus paste for diffusion to a substrate by screen printing to form a diffusion layer on a substrate. The phosphorus paste for diffusion includes at least a doping agent containing a phosphorus as a dopant for the diffusion layer, a thixotropic agent containing an organic binder, and a solid matter, and an organic solvent.

Particularly, in the present invention, the doping agent containing phosphorus as a dopant in the phosphorus paste for diffusion is an organic phosphorus compound.

Thus, the phosphorus paste for diffusion that is used in screen printing is not a water-soluble phosphorus paste but an organic phosphorus paste, whereby it is possible to realize a phosphorus paste for diffusion that does not undergo influence of ambient humidity on viscosity. Therefore, where the organic phosphorus paste for diffusion according to the present invention is used for continuous screen printing, it is ensured that even in the case where a desired pattern of the diffusion layer is a thin-line pattern, clogging of meshes in a screen printing plate is unlikely to occur and the number of times of continuous printing possible on a substrate with a single printing plate can be largely increased, since the paste is restrained from thickening due to repetition of continuous printing. Besides, since clogging of screen meshes is unlikely to occur, the phosphorus paste for diffusion that is applied onto the substrate has fewer defects as compared with a desired diffusion layer pattern.

Further, due to the considerable improvement in the number of times of continuous printing possible, the number of times of cleaning necessary for the screen printing plate is reduced, leading to an enhanced yield and a reduced cost in production of devices.

In addition, since the phosphorus paste for diffusion includes a thixotropic agent containing an organic binder and a solid matter, the thixotropic property of the phosphorous paste for diffusion can be easily controlled. Such a phosphorus paste for diffusion controlled in thixotropic property can be restrained from blurring from a desired pattern at the time of printing.

Especially, due to the organic binder contained therein, the phosphorus paste for diffusion can favorably pass through mesh openings of a screen printing plate. Besides, due to the solid matter contained therein, the reduction in film thickness through drying and the contraction through baking after printing of the phosphorus paste for diffusion can both be easily controlled by regulating the content of the solid matter.

The organic phosphorus compound constituting the doping agent in the organic phosphorus paste for diffusion, preferably, is a monomer having a phosphate group and/or a monomer derivative having a phosphate group. A specific example of the monomer having a phosphate group is acid phosphooxyethyl methacrylate.

This ensures that phosphor in the phosphate group serves as a dopant source for the diffusion layer. As the monomer having a phosphate group and/or the monomer derivative having a phosphate group, those which are commercially available can be used. Thus, easy availability of material is secured.

Specific examples of the organic phosphorus compound include the following commercially available compounds.

$$CH_2=C(CH_3)COO(C_2H_4O)_nP=O(OH)_2 \quad (A)$$

n=1 (acid phosphooxyethyl methacrylate)

Uni Chemical Co., Ltd.; Phosmer M, Nippon Kayaku Co., Ltd.; KAYAMER PM-1, Kyoeisha Chemical Co., Ltd.; LIGHT-ESTER P-M, Shin-Nakamura Chemical Co., Ltd.; NK Ester SA n=2

Uni Chemical Co., Ltd.; Phosmer PE2 n=4 to 5 (acid phosphooxypolyoxyethylene glycol monomethacrylate)

Uni Chemical Co., Ltd.; Phosmer PE n=8

Uni Chemical Co., Ltd.; Phosmer PE8

$$[CH_2=C(CH_3)COO(C_2H_4O)_n]_mP=O(OH)_{3-m} \quad (B)$$

Mixture of n=1, m=1 and n=1, m=2
Daihachi Chemical Industry Co., Ltd.; MR-200

$$CH_2=CHCOO(C_2H_4O)_nP=O(OH)_2 \quad (C)$$

n=1

Uni Chemical Co., Ltd.; Phosmer A, Kyoeisha Chemical Co., Ltd.; LIGHT-ESTER P-A $$[CH_2=CHCOO(C_2H_4O)_n]_mP=O(OH)_{3-m} \quad (D)$$

Mixture of n=1, m=1 and n=1, m=2
Daihachi Chemical Industry Co., Ltd.; AR-200

$$CH_2=C(CH_3)COO(C_2H_4O)_nP=O(OC_4H_9)_2 \quad (E)$$

n=1

Daihachi Chemical Industry Co., Ltd.; MR-204

$$CH_2=CHCOO(C_2H_4O)_nP=O(OC_4H_9)_2 \quad (F)$$

n=1

Daihachi Chemical Industry Co., Ltd.; AR-204

$$CH_2=C(CH_3)COO(C_2H_4O)_nP=O(OC_2H_{17})_2 \quad (G)$$

n=1

Daihachi Chemical Industry Co., Ltd.; MR-208

$$CH_2=CHCOO(C_2H_4O)_nP=O(OC_8H_{17})_2 \quad (H)$$

n=1

Daihachi Chemical Industry Co., Ltd.; AR-208

$$CH_2=C(CH_3)COO(C_2H_4O)_nP=O(OH)(ONH_3C_2H_4OH) \quad (I)$$

n=1

Uni Chemical Co., Ltd; Phosmer MH $$CH_2=C(CH_3)COO(C_2H_4O)_nP=O(OH)(ONH(CH_3)_2C_2H_4OCOC(CH_3)=CH_2) \quad (J)$$

n=1

Uni Chemical Co., Ltd.; Phosmer DM $$CH_2=C(CH_3)COO(C_2H_4O)_nP=O(OH)(ONH(C_2H_5)_2C_2H_4OCOC(CH_3)=CH_2) \quad (K)$$

n=1

Uni Chemical Co., Ltd.; Phosmer DE $$CH_2=CHCOO(C_2H_4O)_nP=O(O\text{-ph})_2 \text{ (ph: benzene ring)} \quad (L)$$

n=1

Daihachi Chemical Industry Co., Ltd.; AR-260

$$CH_2=C(CH_3)COO(C_2H_4O)_nP=O(O\text{-ph})_2 \text{ (ph: benzene ring)} \quad (M)$$

n=1

Daihachi Chemical Industry Co., Ltd.; MR-260

$$[CH_2=CHCOO(C_2H_4O)_n]_2P=O(O\,C_4H_9) \quad (N)$$

n=1

Daihachi Chemical Industry Co., Ltd.; PS-A4

$$[CH_2=C(CH_3)COO(C_2H_4O)_n]_2P=O(OH) \quad (O)$$

n=1
Daihachi Chemical Industry Co., Ltd.; MR-200, Nippon Kayaku Co., Ltd.; KAYAMER PM-2, Nippon Kayaku Co., Ltd.; KAYAMER PM-21

$$[CH_2=CHCOO(C_2H_4O)_n]_3P=O \qquad (P)$$

n=1
Osaka Organic Chemical Industry Ltd.; Viscoat 3PA

Like general acrylic monomers, these organic phosphorus compounds can be synthesized by a dehydration reaction or ester exchange between acrylic acid or methacrylic acid and a phosphoric acid compound. Besides, some of the organic phosphorus compounds may be used by mixing them in an arbitrary ratio. On a synthesis basis, the organic phosphorus compounds of the above formulas are more difficult to synthesize as pure products as the number n indicative of the ethylene oxide chain length in the formula increases. Specific examples of the value of the number n include 0, 1, 2, about 4 to 5, about 5 to 6, about 7 to 9, about 14, about 23, about 40, and about 50, which are non-limitative.

Other organic phosphorus compounds than the above-mentioned can also be used as phosphorus source.

The organic phosphorus compound as the doping agent is used in an amount such that the content of phosphorus is desirably 3 to 10% by weight, more desirably 4 to 7% by weight, based on the total weight of the paste.

The reason why such a range is desirable lies in that good ohmic contact with a metallic electrode is secured, that there is no possibility of lowering in conversion efficiency of the solar cell, that there is little lowering in sheet resistance of the low-concentration diffusion layer due to out diffusion, and that there is no possibility of lowering in conversion efficiency together with lowering in short-circuit current due to an increase in the number of levels.

The solid matter constituting the thixotropic agent in this embodiment is not particularly limited, but preferably is particulate silica. With the solid matter being particulate silica, it is easy to restrain the reduction in film thickness through drying and the contraction through baking, after printing of the paste.

The particulate silica as the solid matter in the thixotropic agent is desirably used in an amount of 5 to 15 parts by weight based on 100 parts by weight of the phosphorus paste for diffusion.

In addition, the content of the solid matter in the paste is desirably not less than 10% by weight. This makes it possible to restrain the reduction in film thickness through drying and the contraction through baking, after printing of the paste for diffusion, and to obtain a phosphorus glass layer having a large thickness.

The organic binder constituting the thixotropic agent in this embodiment is desirably used in an amount of 5 to 20 parts by weight based on 100 parts by weight of the phosphorus paste for diffusion. This makes it possible to obtain a phosphorus paste for diffusion that has suitable viscosity characteristic for printing.

Furthermore, the degree of polymerization of the organic binder is desirably 200 to 2000, more preferably 400 to 800.

Specific examples of the organic binder include linear organic polymers having a film forming property (the term "film forming property" means a property of a compound to form a uniform film when the compound is dissolved in a solvent and is then dried).

Examples of the linear organic polymers include polyvinyl acetate, acrylic resins (polyacrylic acids and their salts, homopolymer and copolymers of hydroxyethyl acrylate, homopolymer and copolymers of hydroxypropyl acrylate, homopolymer and copolymers of hydroxybutyl acrylate), polyvinyl acetal resins (polyvinyl acetate or hydrolyzed polyvinyl acetate with a hydrolyzation degree of not less than 60% by weight, preferably not less than 80% by weight, polyvinyl formal, polyvinyl butyral, polyvinyl alcohol), polyurethane resin, polyurea resin, polyimide resins, polyamide resins, epoxy resin, methacrylic resins (polymethacrylic acids and their salts, homopolymer and copolymers of hydroxymethacrylate, homopolymer and copolymers of hydroxyethyl methacrylate), polystyrene resin, novolak phenolic resins, polyester resins, synthetic rubbers, and natural rubbers (gum Arabic).

The organic binders may be used either singly or in mixture of two or more of them. It is to be noted here, however, that the organic binders should be compatible with the organic phosphorus compound and the organic solvent.

The thixotropic agent in this embodiment is desirably a combination of at least one selected from among particulate silica used as solid matter and the organic binder. This ensures a high ratio between the paste viscosity at the time of generation of a high shear stress and the paste viscosity at the time of generation of a low shear stress.

Particularly, the organic binder in this embodiment is preferably polyvinyl acetate. This is because polyvinyl acetate permits easy control of its property of passing through mesh openings.

In addition, in the case where the organic binder is polyvinyl acetate, polyvinyl acetate is desirably used in an amount of 5 to 30% by weight based on 100% by weight of the phosphorus paste for diffusion. This makes it possible to obtain a paste which has good property of passing through the screen mesh openings, which shows restrained blurring of a printed pattern, and which has good leveling property.

The organic solvent in this embodiment is desirably used in an amount of 30 to 60 parts by weight per 100 parts by weight of the phosphorus paste for diffusion. Besides, the organic solvent is preferably a high-boiling solvent having a boiling point of not less than 100° C. Where the organic solvent contained in the phosphorus paste for diffusion is a high-boiling solvent having a boiling point of not less than 100° C., volatilization of the solvent is restrained, so that there is little variation in composition of the paste, and stable printing can be performed.

Particularly, preferable specific examples of the organic solvent include TPM (isobutylic acid 3-hydroxy-2,2,4-trimethylpentyl ester), which is a high-boiling solvent.

However, the compounds which can be used as high-boiling solvent are not limited to this example.

Examples of the usable solvent include aliphatic hydrocarbon solvents, carbitol solvents, cellosolve solvents, higher fatty acid ester solvents, higher alcohol solvents, higher fatty acid solvents, and aromatic hydrocarbon solvents. Among these solvents, liquid paraffin and aliphatic hydrocarbon solvents are preferably used in view of little odor thereof.

Examples of the aliphatic hydrocarbon solvents include "IP Solvent" produced by Idemitsu Kosan Co., Ltd., "Shellsol D40" (Shellsol is a registered trademark), "Shellsol D70," "Shellsol 70" and "Shellsol 71" produced by Shell Chemical Japan Ltd., "Isopar G," "Isopar H," "Isopar L," "Isopar M," "Exxol D40," "Exxol D80," "Exxol D100," "Exxol D130" (boiling point: 279 to 316° C.), "Exxol D140" (boiling point: 280 to 320° C.), "Exxol DCS100/140" produced by Exxon Mobil Corp. and so on.

In addition, examples of the carbitol solvents include methyl carbitol, ethyl carbitol, butyl carbitol, etc., and examples of the cellosolve solvents include ethyl cellosolve, isoamyl cellosolve, hexyl cellosolve, etc. Besides, examples of the higher fatty acid ester solvents include dioctyl phthalate, isobutyl dibutylsuccinate, isobutyl adipate ester, dibutyl sebacate, di-2-ethylhexyl sebacate, etc., and examples of the higher alcohol solvents include methylhexanol, oleyl alcohol, trimethylhexanol, trimethylbutanol, tetramethylnonanol, 2-pentylnonanol, 2-nonylnonanol, 2-hexyldecanol, etc. In addition, examples of the higher fatty acid solvents include caprylic acid, 2-ethylhexanoic acid, oleic acid, etc., and examples of the aromatic hydrocarbon solvents include butylbenzene, diethylbenzene, dipentylbenzene, diisopropylnaphthalene, etc.

Though these organic solvents may be used singly, they can be used in appropriate combinations for control of viscosity, control of dispersibility in relation to particulate silica used as the solid matter and to the organic binder, control of wettability in relation to a textured silicon crystal substrate, and so on. In the organic phosphorus paste for diffusion in this embodiment, it is preferable to use together the polyvinyl acetate, which is used as the organic binder, and an ester solvent compatible therewith.

The organic phosphorus paste for diffusion in this embodiment may further include a silicon alkoxide. The silicon alkoxide serves as a linker for linking between the organic phosphorus compound used as the doping agent and particulate silica used as the solid matter, and is effective in accelerating the sintering of the phosphorus component with silica during the diffusion heat treatment. Therefore, the silicon alkoxide functions further to prevent outward diffusion of phosphorus. Besides, the silicon alkoxide is preferable in view of low material cost and easy availability.

The silicon alkoxide is desirably used in an amount of 1 to 20 parts by weight in 100 parts by weight of the phosphorus paste for diffusion. Besides, as the silicon alkoxide, such silicon alkoxide compounds as $Si(OCH_3)_4$, $Si(OC_2H_5)_4$, $Si(OC_3H_7)_4$, and $Si(OC_4H_9)_4$ are preferably used in view of their low material cost and easy availability.

Further, the organic phosphorus paste for diffusion in this embodiment, desirably, has a viscosity of 30 to 100 Pa·s when the shear rate of the paste is $20\ s^{-1}$ at 25° C. This ensures that since the paste viscosity at the time of generation of a high shear stress is low, clogging of screen meshes with the paste would not occur even in the case of forming thin-line wiring by screen printing, and a wiring free of such defects as line breakage can be obtained.

In addition, the paste viscosity under a low shear stress when the shear rate of the past is $2\ s^{-1}$ is desirably two to five times the paste viscosity under a shear rate of $20\ s^{-1}$ at 25° C. This ensures that clogging of screen mesh openings with the paste would not occur, blurring of a pattern immediately upon printing can be restrained, and the shape of a high-concentration diffusion layer can be maintained.

Now, an embodiment of the process for producing a solar cell using the organic phosphorus paste for diffusion according to the above-described embodiment will be described below, referring to FIGS. 1 to 3.

Figure 2:
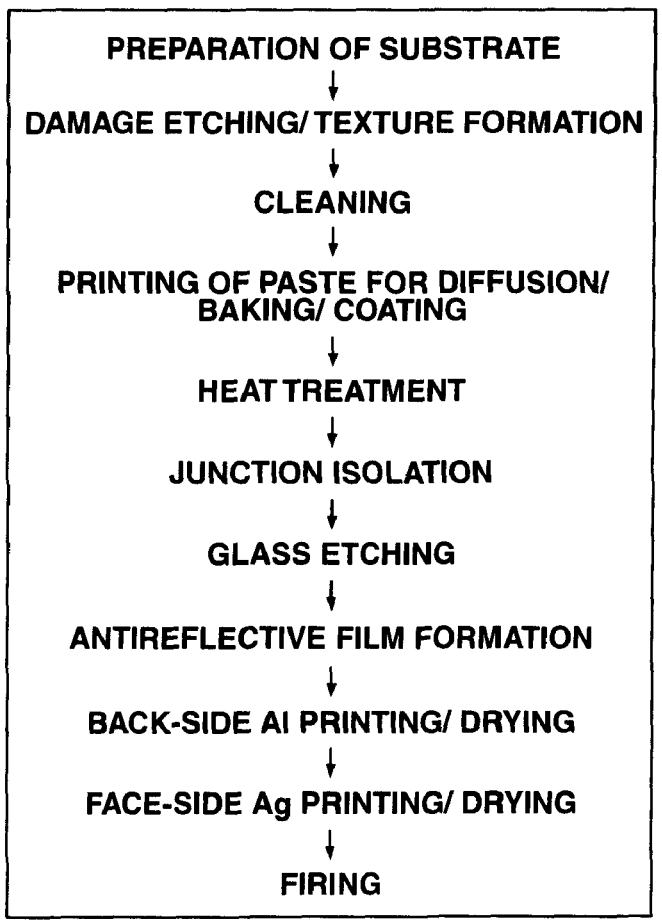
FIG. 2 is a flow chart illustrating the process for producing a solar cell utilizing an organic phosphorus paste for diffusion according to the present invention.

FIG. 1 is a schematic view of a solar cell to be produced, and FIG. 2 is a flow chart illustrating the process for producing a solar cell using the organic phosphorus paste for diffusion according to the present invention. Besides, FIG. 3 shows image illustrations of the flow shown in FIG. 2.

In FIGS. 1 to 3, numeral 1 denotes a substrate, 2 a high-concentration diffusion layer, 3 a low-concentration diffusion layer, 4 a passivation film and/or an antireflective film, 5 a BSF layer, 6 a back-surface electrode, 7 a light-receiving surface comb-shaped electrode, 8 an organic phosphorus paste for diffusion (for screen printing), and 9 denotes a diffusion agent (for spin coating).

First, a gallium-doped p-type single-crystalline silicon substrate 1 is prepared (see FIG. 3(A)). The silicon single crystal substrate may be one produced by the Czochralski (CZ) method or one produced by the floating zone (FZ) method. The resistivity of the substrate is preferably, for example, 0.1 to 20 Ω·cm, particularly 0.5 to 2.0 Ω·cm, for producing a high-performance solar cell.

Next, the substrate 1 prepared is immersed in an aqueous solution of sodium hydroxide to remove a damaged layer by etching. The removal of damages from the substrate may be carried out by using an aqueous solution of a strong alkali such as potassium hydroxide. Besides, the same purpose can also be attained by using an aqueous solution of an acid such as a mixture of hydrofluoric acid with nitric acid.

The substrate 1 having undergone the damage etching is formed with a random texture.

Normally, a solar cell is preferably provided with a rugged shape in its surface. The reason lies in that, in order to reduce reflectance in visible region, reflection should be effected two or more times at the light-receiving surface. The size of each of projections in the rugged pattern may be about 1 to 20 μm. Typical examples of the rugged surface structure include V-grooves and U-grooves. These can be formed by utilizing a grinder. In addition, a random rugged structure can be produced by wet etching through immersion in an aqueous solution prepared by adding isopropyl alcohol to sodium hydroxide. Alternatively, the random rugged structure can be formed by acid etching, reactive ion etching or the like. In FIGS. 1 and 3, texture structures formed on both surfaces are omitted, since they are so fine.

Next, a two-stage (two-level) emitter composed of a high-concentration diffusion layer 2 and a low-concentration diffusion layer 3 is formed. The high-concentration diffusion layer is formed by printing the above-mentioned organic phosphorus paste for diffusion 8 by a screen printing press, followed by baking (see FIG. 3(B)). The low-concentration diffusion layer can be formed by spin coating a diffusion agent for spin coating 9 containing diphosphorus pentoxide and a silicon alkoxide (see FIG. 3(C)), followed by a diffusion heat treatment (see FIG. 3(D)). Such a production process ensures that while obtaining ohmic contact, surface recombination at other areas of the light-receiving surface than the electrode area and recombination inside the emitter are restrained, whereby photo-electric conversion efficiency can be enhanced.

Another embodiment of the process of forming the two-stage emitter is a process in which both the high-concentration diffusion layer and the low-concentration diffusion layer are formed by screen printing.

Specifically, an organic phosphorus paste for diffusion for forming the high-concentration diffusion layer is printed in the form of a plurality of lines or dot patterns on a p-type semiconductor substrate, and then an organic phosphorus paste for diffusion for forming the low-concentration diffusion layer is printed so as to make contact with at least a part of the organic phosphorus paste for diffusion for forming the high-concentration diffusion layer that has been applied to the semiconductor substrate 1. Then, the substrate with the two kinds of phosphorus pastes for diffusion printed thereon is subjected to a heat treatment.

In this case, the content of phosphorus in the organic phosphorus paste for diffusion for forming the high-concentration diffusion layer is preferably not less than two times the content of phosphorus in the organic phosphorus paste for diffusion for forming the low-concentration diffusion layer.

By utilizing either one of the above-mentioned methods, the high-concentration diffusion layer and the low-concentration diffusion layer can be formed, with a surface concentration difference secured therebetween. In addition, the heat treatment is required only once for forming the two-stage emitter, so that a high-performance solar cell can be obtained notwithstanding the very simple process.

Next, junction isolation is carried out using a plasma etching system. In this process, in order to prevent penetration of plasma or radicals to the light-receiving surface or the back surface, the samples are stacked and, in that condition, end faces are etched away by a few micrometers.

Subsequently, the phosphorus glass formed on the surface is etched by hydrofluoric acid, and thereafter a nitride film 4 as a surface protective film is deposited on the emitter layer by using a direct plasma enhanced CVD system. A suitable thickness for the nitride film 4 is 70 to 100 nm, since the nitride film 4 is made to function also as an antireflective film. Other examples of the antireflective film include an oxide film, a titanium dioxide film, a zinc oxide film, a tin oxide film, etc., which are replaceable. Besides, other examples of the film forming method include remote plasma enhanced CVD method, coating method, vacuum evaporation method, etc. From the viewpoint of economy, it is preferable to form the nitride film by a plasma enhanced CVD method.

Furthermore, when a condition for minimizing the total reflectance is provided on the above-mentioned antireflective film, for example, when a film having a refractive index from 1 to 2 such as a magnesium difluoride film is formed on the antireflective film, a further lowering in reflectance is attained, and the generated current density is enhanced.

Next, a paste including aluminum, for example, is applied to the back surface by using a screen printing press, followed by drying. Further, using a screen printing press and a comb-shaped electrode pattern printing plate, an Ag electrode is printed on the face side, followed by drying. The BSF layer 5 is formed by the firing step after the printing of aluminum.

In this case, utilizing an alignment mechanism, the comb-shaped electrode is so printed as to be located on the part where the phosphorus paste for diffusion has been printed in a striped pattern.

Thereafter, firing is conducted according to a predetermined heat profile, whereby the back-side electrode 6 and the face-side comb-shaped electrode 7 are formed. The method for forming these electrodes is not limited to the above-mentioned printing method, for example, a vacuum evaporation method, a sputtering method and the like can also be adopted.

Accordingly, a solar cell as shown in FIG. 1 can be produced by a simple technique.

In a process for simultaneously producing a large number of the solar cells as above, the coating of the paste for diffusion is applied by printing on the substrates sequentially and continuously.

The screen printing plate used for continuous printing in this manner would undergo heavier clogging of the mesh openings as the number of times of use increases. Where the organic phosphorus paste for diffusion according to the present invention as above-described is used, however, the number of times of continuous printing possible with a single screen printing plate can be greatly improved, since the organic phosphorus paste for diffusion has a viscosity controllable to a desired viscosity without undergoing influence of ambient humidity on viscosity and is excellent in stability of continuous printing.

EXAMPLES

Now, the present invention will be specifically described below showing Examples and Comparative Examples, but the invention is not limited to the Examples.

Example 1

Preparation of Phosphorus Paste for Diffusion

An organic phosphorus paste for diffusion was prepared by blending the following materials.
Doping Agent (Containing Phosphorus)
Phosmer M (Uni Chemical) and Phosmer MH (Uni Chemical): 200 g
Thixotropic Agent (Solid Matter)
Particulate silica (size: about 1.5 µm): 75 g
Thixotropic Agent (Organic Binder)
Polyvinyl acetate (polymerization degree: about 500): 100 g
Organic Solvent
TMP (isobutylic acid 3-hydroxy-2,2,4-trimethylpentyl ester) (boiling point: 244° C.): 320 g The viscosity of the organic phosphorus paste for diffusion of Example 1 prepared as above was measured by a viscometer (a product by BLOOKFIELD). The viscosity was about 50 Pa·s when the shear rate of the paste at 25° C. was 20 s$^{-1}$, and about 130 Pa·s when the shear rate of the paste at 25° C. was 2 s$^{-1}$.

Example 2

Production of Solar Cell

Using the organic phosphorus paste for diffusion blended in Example 1, a solar cell was produced by the process as described in the above embodiment of the process for producing a solar cell.

The substrate prepared in this case was a gallium-doped p-type single-crystalline silicon substrate having a crystal face orientation (100), measuring 15.65 cm square and 200 µm in thickness, and having an as-sliced resistivity of 2 Ω·cm (dopant concentration $7.2 \times 10^{15}$ cm$^{-3}$).

Besides, as the method for forming the two-stage emitter, the former means was adopted.

More specifically, first, the organic phosphorus paste for diffusion of Examples 1 was printed by a screen printing press. The printed pattern was composed of lines of 150 µm in width which were arranged at a pitch of 2 mm. The printed pattern was baked at 700 to 800° C. for five minutes, and thereafter a diffusion agent for spin coating which contained diphosphorus pentoxide and a silicon alkoxide was applied to the same surface by spin coating under the conditions of 5000 rpm and 15 seconds. After the spin coating, the substrate was placed in a heat treatment furnace, was maintained at 880° C. for 40 minutes, and taken out of the furnace.

The solar cell produced in Example 2 was put to measurement of sheet resistance at other part than the diffusion paste printed part formed as the low-concentration emitter. The sheet resistance was 80 to 110 Ω/sq.

In addition, the solar cell was put to measurement of current-voltage characteristics in a 25° C. atmosphere under a solar simulator (light intensity: 1 kW/m$^2$, spectrum: AM 1.5 global). The results are shown in Table 1. The values given in Table 1 are mean values obtained by measurement of the characteristics for 100 solar cell samples produced.

Example 3

Further, continuous production of solar cells from a large volume of substrates was conducted in the steps of Example 2 using the organic phosphorus paste for diffusion blended in Example 1.

As a result, in the step of continuously performing screen printing, printing of the phosphorus paste for diffusion could be continued up to the number of times of printing of 30000, which corresponds to the useful life of the screen printing plate, without a need to clean the screen printing plate.

Comparative Example 1

Preparation of Phosphorus Paste for Diffusion

A water-soluble phosphorus paste for diffusion was prepared by blending 50 g of phosphoric acid, 100 g of polyvinyl alcohol, 100 g of silica, 200 g of ethanol, and 30 g of water.

The viscosity of the water-soluble phosphorus paste for diffusion of Comparative Example 1 prepared as above was measured by a viscometer (a product by BLOOKFIELD). The viscosity of the paste was about 40 Pa·s when the shear rate of the paste at 25° C. was 20 s$^{-1}$, and about 100 Pa·s when the shear rate of the paste at 25° C. was 2 s$^{-1}$.

Comparative Example 2

Production of Solar Cell

For comparison, a solar cell was produced by the same process as in Example 2, except that the phosphorus paste for diffusion that had been prepared in Comparative Example 1 was used to form the high-concentration diffusion layer.

The solar cell produced in Comparative Example 2 was put to measurement of sheet resistance at other part than the diffusion paste printed part formed as the low-concentration emitter. The sheet resistance was 80 to 110 Ω/sq.

Besides, the solar cell was put to measurement of current-voltage characteristics in a 25° C. atmosphere under a solar simulator (light intensity: 1 kW/m$^2$, spectrum: AM 1.5 global). The results are shown in Table 1. The values given in Table 1 are mean values obtained by measurement of the characteristics for 100 solar cell samples produced.

Comparative Example 3

Further, continuous production of solar cells from a large volume of substrates was conducted in the steps of Example 2 using the water-soluble phosphorus paste for diffusion blended in Comparative Example 1.

As a result, in the step of continuously performing screen printing, severe clogging of mesh openings of the screen printing plate was observed at the number of times of printing of about 2500, and the screen printing plate could not be used then unless cleaned.

TABLE 1

| | Open-circuit voltage (V) | Short-circuit current density (mA/cm$^2$) | Conversion efficiency (%) | Fill factor |
|---|---|---|---|---|
| Example 2 (Organic phosphorus paste of Example 1 was used) | 0.638 | 36.2 | 18.2 | 0.789 |
| Comparative Example 2 (Water-soluble phosphorus paste of Comparative Example 1 was used) | 0.632 | 36.5 | 18.2 | 0.791 |

From the results shown in Table 1 above, it is seen that no significant performance difference in characteristics between the solar cell produced in Example 2 and the solar cell produced in Comparative Example 2. On the other hand, for comparison between Example 3 and Comparative Example 3, FIG. 4 shows the relationship between the number of times of continuous printing and the paste viscosity. When the water-soluble phosphorus paste and the organic phosphorus paste having comparable initial viscosities are used for continuous printing on a printing plate, the water-soluble phosphorus paste undergoes thickening due to dehumidification and becomes unable to be used for printing after used for printing about 2500 times, whereas the organic phosphorus paste does not undergo a significant change in viscosity and is able to be used for printing permanently.

It is seen from FIG. 4 that the use of the organic phosphorus paste for diffusion according to the present invention ensures that printing can be repeated an overwhelmingly larger number of times. Therefore, when the organic phosphorus paste for diffusion of the present invention prepared in Example 1 is utilized for production of the solar cell, the production yield is enhanced to an excellent level. Consequently, products sufficiently competitive in the solar cell market can be produced.

While the solar cell as one of semiconductor devices has been described in detail in the foregoing, the present invention is not limited to the solar cell. Naturally, the organic phosphorus paste for diffusion according to the present invention is also applicable to other semiconductor devices in which diffusion layers different in surface concentration are provided in a plane.

Furthermore, the present invention is not limited to the above-described embodiment. The above embodiment is merely an example, and any one that has substantially the same configuration as the technical thought described in the claims of the present invention and that shows an identical or similar effect to the above-mentioned is included in the

The invention claimed is:

1. A phosphorus paste for diffusion that is applied to a substrate by screen printing for forming a diffusion layer on the substrate, the phosphorus paste for diffusion comprising at least:
    a doping agent containing phosphorus as a dopant for the diffusion layer;
    a thixotropic agent containing an organic binder and a solid matter; and
    an organic solvent;
    wherein the doping agent is an organic phosphorus compound which is synthesized by a dehydration reaction or ester exchange between acrylic acid or methacrylic acid and a phosphoric acid compound.

2. The phosphorous paste for diffusion according to claim 1, wherein the solid matter is particulate silica.

3. The phosphorus paste for diffusion according to claim 1, wherein the organic binder is polyvinyl acetate.

4. The phosphorus paste for diffusion according to claim 1, wherein the organic solvent is a high-boiling solvent having a boiling point of not less than 100° C.

5. The phosphorus paste for diffusion according to claim 1, further comprising a silicon alkoxide.

6. A process for producing a solar cell using the phosphorus paste for diffusion according to claim 1, the process comprising coating a substrate with the phosphorus paste for diffusion by screen printing, and subjecting the substrate to a heat treatment to form a diffusion layer.

7. The phosphorus paste for diffusion according to claim 1, wherein the doping agent includes at least one organic phosphorus compound selected from the group consisting of the following compounds (A) to (P):

$$CH_2=C(CH_3)COO(C_2H_4O)_nP=O(OH)_2 \text{ wherein n is } 1, 2, 4 \text{ to } 5, \text{ or } 8, \quad (A)$$

$$[CH_2=C(CH_3)COO(C_2H_4O)_n]_mP=O(OH)_{3-m} \text{ wherein mixture of } n=1, m=1 \text{ and } n=1, m=2, \quad (B)$$

$$CH_2=CHCOO(C_2H_4O)P=O(OH)_2, \quad (C)$$

$$[CH_2=CHCOO(C_2H_4O)_n]_mP=O(OH)_{3-m} \text{ wherein mixture of } n=1, m=1 \text{ and } n=1, m=2, \quad (D)$$

$$CH_2=C(CH_3)COO(C_2H_4O)P=O(OC_4H_9)_2, \quad (E)$$

$$CH_2=CHCOO(C_2H_4O)P=O(OC_4H_9)_2, \quad (F)$$

$$CH_2=C(CH_3)COO(C_2H_4O)P=O(OC_8H_{17})_2, \quad (G)$$

$$CH_2=CHCOO(C_2H_4O)P=O(OC_8H_{17})_2, \quad (H)$$

$$CH_2=C(CH_3)COO(C_2H_4O)P=O(OH)(ONH_3C_2H_4OH), \quad (I)$$

$$CH_2=C(CH_3)COO(C_2H_4O)P=O(OH)(ONH(CH_3)_2C_2H_4OCOC(CH_3)=CH_2), \quad (J)$$

$$CH_2=C(CH_3)COO(C_2H_4O)P=O(OH)(ONH(C_2H_5)_2C_2H_4OCOC(CH_3)=CH_2), \quad (K)$$

$$CH_2=CHCOO(C_2H_4O)P=O(O\text{-ph})_2 \text{ wherein ph is phenyl}, \quad (L)$$

$$CH_2=C(CH_3)COO(C_2H_4O)P=O(O\text{-ph})_2 \text{ wherein ph is phenyl}, \quad (M)$$

$$[CH_2=CHCOO(C_2H_4O)]_2P=O(OC_4H_9), \quad (N)$$

$$[CH_2=C(CH_3)COO(C_2H_4O)]_2P=O(OH), \text{ and} \quad (O)$$

$$[CH_2=CHCOO(C_2H_4O)]_3P=O. \quad (P)$$

8. The phosphorus paste for diffusion according to claim 4, wherein the organic solvent is a high-boiling solvent selected from the group consisting of aliphatic hydrocarbon solvents, carbitol solvents, higher fatty acid ester solvents, higher alcohol solvents, higher fatty acid solvents, an aromatic hydrocarbon solvents.

9. The phosphorus paste for diffusion according to claim 8, wherein the organic solvent is a high-boiling solvent selected from the group consisting of dioctyl phthalate, isobutyl dibutylsuccinate, isobutyl adipate ester, dibutyl sebacate, di-2-ethylhexyl sebacate, and isobutylic acid 3-hydroxy-2,2,4-trimethylpentyl ester.

* * * * *

UNITED STATES PATENT AND TRADEMARK OFFICE
CERTIFICATE OF CORRECTION

PATENT NO.       : 8,405,176 B2
APPLICATION NO.  : 12/933738
DATED            : March 26, 2013
INVENTOR(S)      : Tsukigata et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 87 days.

Signed and Sealed this
First Day of September, 2015

Michelle K. Lee
*Director of the United States Patent and Trademark Office*